United States Patent [19]

Lewyn et al.

[11] 4,360,789
[45] Nov. 23, 1982

[54] VERY LOW CURRENT PIERCE OSCILLATOR

[75] Inventors: Lanny L. Lewyn, Laguna Beach; Charles H. Lucas, Newport Beach, both of Calif.

[73] Assignee: Hughes Aircraft Company, Culver City, Calif.

[21] Appl. No.: 169,554

[22] Filed: Jul. 17, 1980

[51] Int. Cl.³ .............................................. H03B 5/36
[52] U.S. Cl. .............................. 331/109; 331/116 FE; 368/159
[58] Field of Search .......... 331/116 FE, 109, 117 FE; 368/159

[56] References Cited

U.S. PATENT DOCUMENTS

| | | | |
|---|---|---|---|
| 3,902,141 | 8/1975 | Berney | 331/116 FE |
| 4,013,797 | 3/1977 | Vittoz | 331/116 FE X |
| 4,039,973 | 8/1977 | Yamashiro | 331/116 FE |
| 4,095,195 | 6/1978 | Saito | 331/116 FE |
| 4,106,278 | 8/1978 | Yasada | 331/116 FE X |
| 4,211,985 | 7/1980 | Yamashiro | 331/116 FE |

FOREIGN PATENT DOCUMENTS 2933854  3/1980  Fed. Rep. of Germany ...... 331/116 FE

OTHER PUBLICATIONS

RCA COS/MOS Integrated Circuits Manual, RCA Solid State Division, Summerville, N.J., 1971, pp. 138-148.

*Primary Examiner*—Siegfried H. Grimm
*Attorney, Agent, or Firm*—Robert M. Wallace; W. H. MacAllister; A. W. Karambelas

[57] ABSTRACT

A very low current Pierce oscillator has two pairs of complementary field-effect transistors (FET's) and a two-terminal quartz crystal. The gates of the first complementary FET pair are coupled through individual capacitors to one terminal of the quartz crystal, their drains being connected together and to the other quartz crystal terminal. Current flow through the crystal oscillator is minimized by a novel oscillator bias loop connected between the gates of the first FET pair. Amplification is provided by the second FET pair which have a commonly connected drain comprising the oscillator output node. The gates of the second FET pair are each connected to a respective one of the gates of the first FET pair. The oscillator bias loop minimizes the source-to-drain current through the first FET pair by reducing the P-channel FET gate voltage in response to the source-to-drain current. The oscillator bias loop assures reliable start-up by permitting the oscillation of the source-to-drain current to increase freely to some large magnitude and then operates to reduce the amplitude of the oscillation and also the dc bias level of the current to an equilibrium condition. Means are provided for preventing elements within the oscillator bias loop from overloading the oscillator or otherwise preventing the initiation of oscillation at start-up.

15 Claims, 9 Drawing Figures

VERY LOW CURRENT PIERCE OSCILLATOR

TECHNICAL FIELD

This invention is related to electronic watch circuits formed on a semiconductor substrate and in particular to Pierce oscillators useful in such circuits.

BACKGROUND ART

Microelectronic circuits useful in electronic watches are typically formed as metal oxide semiconductor (MOS) devices on a single semiconductive substrate. The circuits are powered by a miniature battery and both the battery and the substrate are enclosed within the watch and control its display. The watch circuit typically includes a crystal oscillator which may be of the type disclosed in *RCA COS/MOS Integrated Circuits Manual*, RCA Solid State Division, Summerville, N.J., 1971, pages 138 through 148, the disclosure which is hereby incorporated herein by reference. A typical crystal oscillator complementary metal oxide semiconductor (CMOS) circuit includes a passive resonator such as a quartz crystal having two terminals connected across the input and output of an inverter amplifier comprising a P-channel MOS Field Effect Transistor (FET) and an N-channel MOSFET, the two MOSFETS having their drains connected together and to one terminal of the quartz crystal and having their gates connected together and to the other terminal of the quartz crystal. As discussed in the above-referenced RCA publication, the crystal oscillator will not function unless the oscillator loop gain is greater than unity. The disadvantage with this type of prior art oscillator is that, for a loop gain sufficiently greater than unity to assure reliable operation, the oscillator consumes a nominal amount of current on the order of one or two microamps. Because the miniature battery associated with the watch circuit has a limited capacity, the nominal current draw of the oscillator is a critical factor and must be minimized.

An improved crystal oscillator circuit of the prior art which has less current draw includes an N-channel FET having a two-terminal quartz crystal connected across its gate and drain. The current draw of the crystal oscillator is minimized by means of a P-channel FET connected between the N-channel FET drain and the power supply. A bias control circuit regulates the gate voltage of the P-channel FET in order to minimize the source-to-drain current through both the N and P-channel FET'S, significantly reducing the nominal current consumed by the crystal oscillator. However, the output from this circuit is too weak to drive additional elements in the watch circuit. Therefore, an additional amplifier stage is provided in order to boost the oscillator output so as to be useful in a watch circuit. Unfortunately, the additional amplifier stage consumes more current. Also, only the N-channel FET oscillates with the quartz crystal, the P-channel FET merely providing a regulated source of current. Therefore, for a given amount of oscillator gain, this improved crystal oscillator circuit requires at least approximately 1.6 times more current through the N-channel FET than the previously described crystal oscillator. Nevertheless, because of the presence of the amplifier stage, the gain requirement is less and, with current regulation, the improved crystal oscillator consumes less current than the previously described crystal oscillator. The limitations of the improved oscillator circuit are that, as oscillator stage current consumption is reduced, additional amplifier stage current is consumed. In addition only one FET oscillates with the crystal, thus requiring the one oscillating FET to draw more current to achieve a given amount of oscillator gain in comparison to a complimentary oscillator stage using both N-channel and P-channel MOSFETS. Thus, it has not seemed possible in the art to further significantly reduce the current consumption of crystal oscillators useful in watch circuits.

SUMMARY OF THE INVENTION

The limitations of the prior art are overcome in the present invention, a very low current Pierce oscillator, having two pairs of complementary N-channel and P-channel FET's and a two-terminal quartz crystal. The gates of the first complementary FET pair are coupled through individual capacitors to one terminal of the quartz crystal, their drains being connected together and to the other quartz crystal terminal. Current flow through the crystal oscillator is minimized by a novel oscillator bias loop connected between the gates of the first FET pair. Amplification is provided by connecting the gates of the first FET pair to the gates of the second FET pair which have a commonly connected drain comprising the oscillator output node.

The oscillator bias loop minimizes the source-to-drain current through the first FET pair by reducing the P-channel FET gate voltage in response to the source-to-drain current. The oscillator bias loop senses the source-to-drain current through the first FET pair through a low-pass filter controlling a current regulator. When the crystal oscillator is first turned on, the amplitude of the crystal oscillation increases, which decreases the output from the low-pass filter to the current regulator. In response, the current regulator supplies a more positive voltage to the gate of the first P-channel FET, causing its source-to-drain current to decrease to an equilibrium current which is very small. The current regulator includes means for preventing elements within the current regulator from loading the oscillator, which would otherwise prevent the oscillator from starting oscillation when it is first turned on.

The invention permits the oscillator to be reliably started by permitting the oscillation of the source-to-drain current to the first FET pair to increase freely to some large magnitude when power is first applied, but also minimizes the nominal current draw of the crystal oscillator because, after oscillation has been achieved, the current regulator operates to reduce the source-to-drain current through the first FET pair to a minimum value.

A large output is achieved at the oscillator output node because the second FET pair have their gates tied to the gates of the first FET pair and have a larger width-to-length ratio than the first pair so that the oscillation amplitude of the source-to-drain current through the second FET pair is larger. The current consumption of the oscillator of this invention is significantly reduced from 170 nanoamps in the prior art to 15 nanoamps nominal, due in part to the operation of the current regulator described above. Furthermore, because both of the FET's of the first complementary pair oscillate in synchronism with the quartz crystal, the oscillator gain is proportional to the sum of the currents through both of them, thus reducing the amount of current required for a given oscillator gain by a factor greater than 1.6 from that of the improved oscillator of the prior art discussed above. Therefore, a smaller source-to-drain current through the first FET pair will sustain oscillation in the present invention, thus reducing the requisite current consumption of the oscillator.

BRIEF DESCRIPTION OF THE DRAWINGS

The invention is best understood by reference to the accompanying drawings, of which.

DETAILED DESCRIPTION OF THE INVENTION

Figure 1:
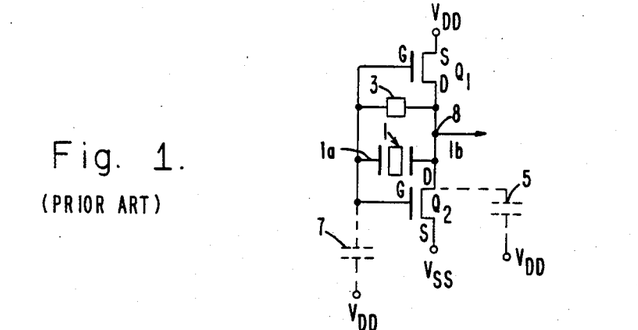
FIG 1 is a simplified schematic diagram of a crystal oscillator of the prior art.

I. Prior Art:

Referring to the schematic diagram of FIG. 1, a simple Pierce crystal oscillator of the prior art includes a quartz crystal 1 having two terminals, a P-channel MOSFET Q1, an N-channel MOSFET Q2 and a resistive element 3. The MOSFETS Q1, Q2 have their gates connected together and to terminal 1a of the quartz crystal 1, while their drains are connected together and to terminal 1b of the quartz crystal 1. The source of the N-channel MOSFET Q2 is connected to a voltage source $V_{ss}$ while the source of the P-channel MOSFET Q1 is connected to a voltage source $V_{dd}$. The resistive element 3 is connected across the quartz crystal terminals 1a, 1b. Tuning capacitors 5, 7 are connected to the drain and gate, respectively, of the N-channel MOSFET Q2. The output node 8 is the commonly connected drain of the MOSFETS Q1, Q2. The voltage and current at the output node 8 oscillates in synchronism with the oscillation of the quartz crystal 1, as does the gate voltage and source-to-drain voltage of each of the MOSFETS Q1, Q2.

The disadvantage of the crystal oscillator of FIG. 1 is that the source-to-drain current of the MOSFETS Q1, Q2 is on the order of one or two microamps under typical operating conditions. The typical operating conditions require that the voltage source $V_{ss}$ be on the order of negative 1 to 3 volts while the voltage source $V_{dd}$ is ground.

The current flow through the crystal oscillator of FIG. 1 is (small because the MOSFETS Q1, Q2 are preferably operated in the saturated mode in order to insure that each is alternately turned off in synchronism with the oscillation of the crystal 1. In the saturated mode, the drain-to-source voltage $V_{ds}$ across each FET Q1, Q2 is greater than the difference between its gate-to-source voltage $V_{gs}$ and its threshold voltage $V_t$ or, $V_{ds} > V_{gs} - V_t$. When the source-to-drain current through the FET Q1 is turned fully on, the source-to-drain current to the FET Q2 is turned off and visa versa.

Figure 2:
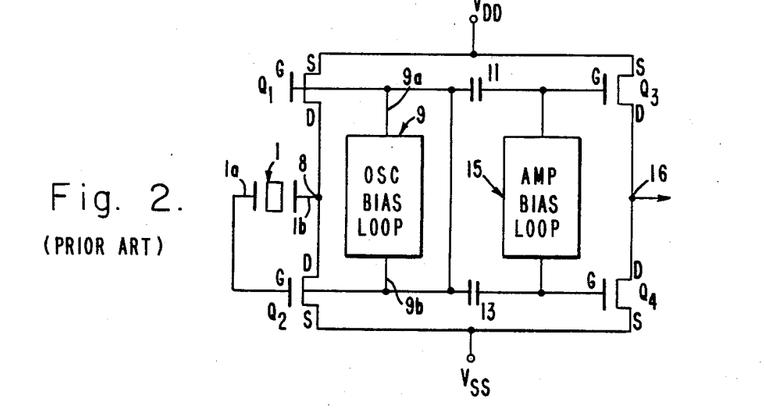
FIG. 2 is a schematic diagram of an improved crystal oscillator of the prior art having an oscillator bias loop and an additional amplifier stage including an amplifier bias loop.

An improved Pierce crystal oscillator of the prior art is shown in the schematic diagram of FIG. 2. In this improved circuit, the gate of the P-channel FET Q1 is not connected to the quartz crystal terminal 1a but is instead connected to output 9a of an oscillator bias loop 9 having its input 9b connected to the gate of the N-channel FET Q2. The oscillator bias loop 9 responds to the variations in the gate voltage of the FET Q2 to regulate the gate voltage of the FET Q1 so as to minimize the source-to-drain current flow through the oscillating N-channel FET Q2. In this manner, the total current consumption of the FETS Q1, Q2 in the circuit of FIG. 2 is significantly less than in the circuit of FIG. 1 because the gate voltage of the N-channel FET Q2 oscillates with a much smaller amplitude (below threshold) in the circuit of FIG. 2 in comparison with the gate voltage oscillation achieved in the circuit of FIG. 1. Therefore, the oscillation of the source-to-drain current at the node 8 is smaller so that some amplification is required. For this purpose, the gate voltage of the oscillating FET Q2 is coupled through capacitors 11 and 13 to the gates of P and N-channel FETS Q3, Q4, respectively. An amplifier bias loop 15 imposes a bias level on the ocillating gate voltage coupled through the capacitors 11, 13 so that the AC component of the gate voltages of the FETS Q3, Q4 oscillate about the threshold voltages of the FETS Q3, Q4. As a result, source-to-drain current flow through the output FETS Q3, Q4 is alternately saturated in one while the other is turned off in synchronism with the oscillation of the crystal 1 so that the oscillation of the current at the output node 16 of the commonly connected drains of the FETS Q3, Q4 has a sufficient amplitude.

The disadvantages of the circuit of FIG. 2 are that the P-channel FET Q1 does not oscillate in synchronism with the crystal 1 but merely provides a current source to the FET Q2. As a result, the source-to-drain current flow through the oscillating N-channel FET Q2 must be at least 1.6 times as much in the circuit of FIG. 2 as in the circuit of FIG. 1 for a given oscillator loop gain. Furthermore, the amplifier bias loop 15 consumes a significant amount of current. The Pierce crystal oscillator of FIG. 2 is discussed in U.S. Pat. No. 4,013,979 by Vittoz, the disclosure of which is hereby incorporated herein by reference.

Figure 3:
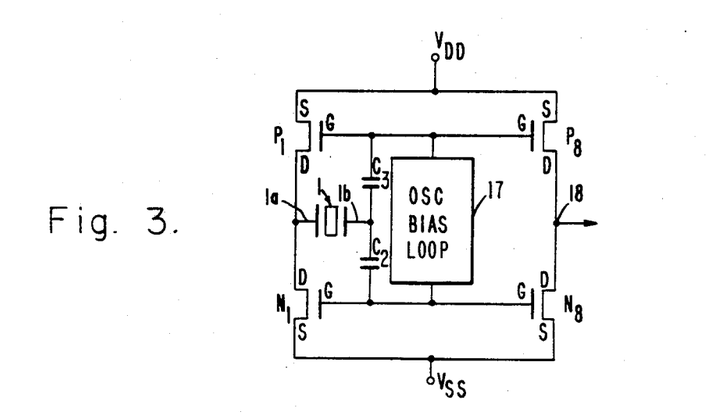
FIG. 3 is a simplified schematic diagram of the crystal oscillator of the present invention.

II. Very Low Current Pierce Oscillator:

Referring to the schematic diagram of FIG. 3, the Pierce crystal oscillator of the present invention achieves remarkable reduction in current consumption from that of the prior art discussed above and includes P and N-channel oscillating FETS P1, N1 and P and N-channel output FETS P8 and N8 respectively, the gates of the P-channel FETS being connected together and the gates of the N-channel FETS being connected together. The drains of the oscillating FETS N1, P1 are connected together and to the quartz crystal terminal 1a while their gates are coupled through capacitors C2, C3 respectively, to the quartz crystal terminal 1b. An oscillator bias loop 17 is connected between the gates of the oscillating FETS N1, P1. However, in contrast to the prior art oscillator illustrated in FIG. 2, the oscillator of the present invention illustrated in FIG. 3 operates so that both FETS N1 and P1 oscillate in synchronism with the crystal 1, causing their source-to-drain current to be about 1.6 times less than that of the oscillator of FIG. 2 for a given amount of oscillator loop gain.

The oscillator bias loop 17 regulates the gate voltage of the P-channel FET P1 so that the gate voltages of the oscillating FETS N8 and P8 oscillate near the threshold voltages of the FETS N1, P1 respectively. Therefore, the output FETS N8, P8 are alternately turned completely on and then completely off because their gate voltages are coupled directly to the gates of the oscillating FETS N1, P1 respectively. As a result, the amplifier bias loop 15 of the prior art circuit of FIG. 2 is not necessary in the crystal oscillator of the present invention illustrated in FIG. 3. Consequently, the current drain of the amplifier bias loop 15 is eliminated in the present invention.

As will be described below in more detail, the novel oscillator bias loop 17 insures reliable initiation of oscillation when the circuit of FIG. 3 is first powered up by permitting the oscillation of the source-to-drain current of the FET's N1, P1 to increase freely in amplitude until a particular amplitude is reached, at which time the oscillator bias loop 17 operates to reduce the source-to-drain conductivity through the FET P1 in order to minimize the current consumption of the entire circuit.

Figure 4:
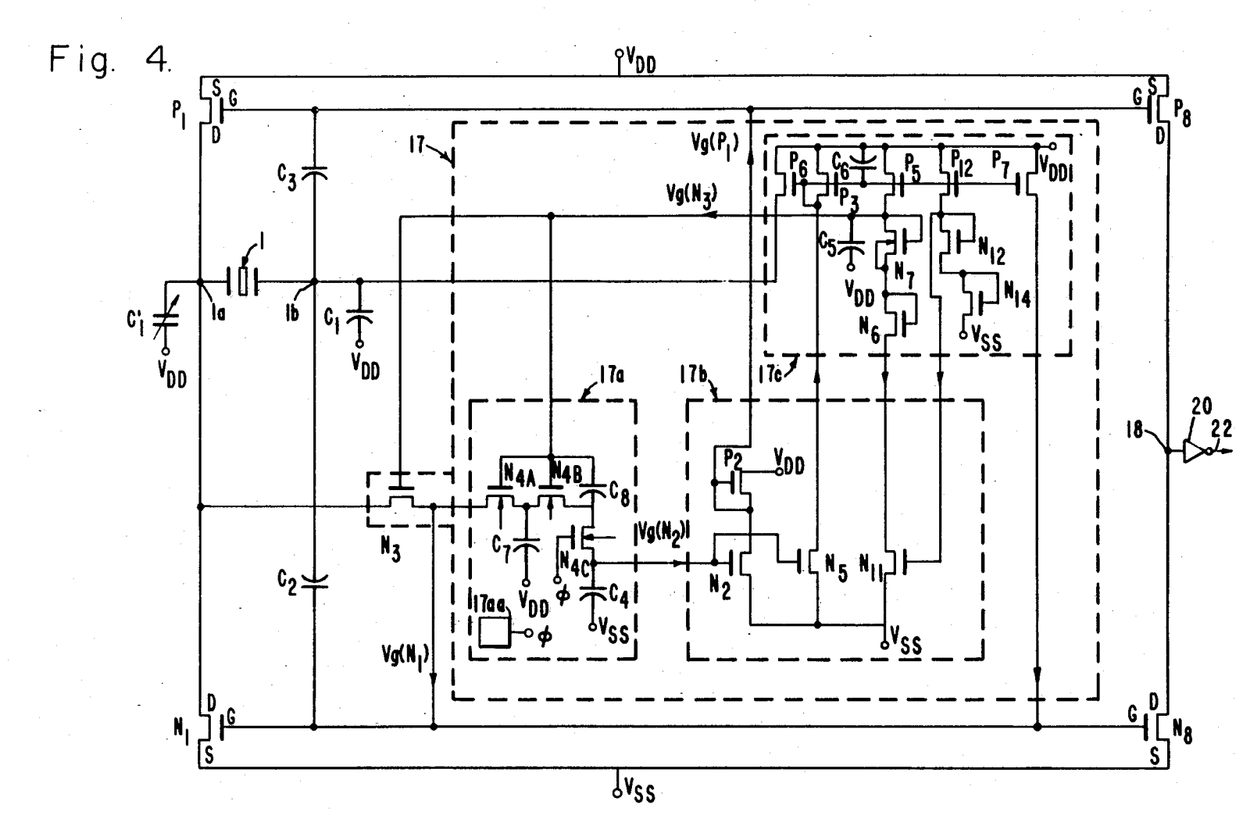
FIG. 4 is a detailed schematic diagram of the crystal oscillator of the present invention.

The invention is illustrated in detail in the schematic diagram of FIG. 4. The novel circuit includes three complementary MOSFET pairs comprising the oscillating FET pair, N1, P1 the output FET pair N8, P8 and a current regulator complementary MOSFET pair N2, P2 included in the oscillator bias loop 17. As defined in the specification, FETS denoted by the first letter "P" are understood to be P-channel MOSFETS while those designated with the first letter "N" are understood to be N-channel MOSFETS, both types being formed on the N-type substrate, the N-channel MOSFETS being formed in P-type well regions formed in the N-type substrate in a manner well known to those skilled in the art.

A. Oscillator Loop

Referring to FIG. 4, the oscillator loop includes the quartz crystal 1 and its tuning capacitor C1, the oscillating complementary MOSFET pair N1, P1 and the gate coupling capacitors C2, C3. The drains of the oscillating FETS N1, P1 are connected together and to the quartz crystal terminal 1a to which an external variable tuning capacitor C1' is also connected. The other side of the tuning capacitor C1' is connected to the voltage reference $V_{dd}$. The gates of the oscillator FET pair N1, P1 are connected through the capacitors C2, C3 respectively to the other quartz crystal terminal 1b, the terminal 1b being connected through tuning capacitor C1 to the voltage reference $V_{dd}$. The sources of the oscillating FET pair N1, P1 are connected to the voltage references $V_{ss}$ and $V_{dd}$ respectively. As the quartz crystal 1 oscillates, the voltage at the crystal terminal 1b oscillates in synchronism with the electric field in the crystal 1 and is coupled through the capacitors C2, C3 to the gates of the oscillating FETS N1, P1. When the voltage at the crystal output terminal 1b is high, the source-to-drain current through the oscillating FET N1 is at maximum while the source-to-drain current to the oscillating FET P1 is at a minimum. Conversely, when the oscillating voltage at the crystal terminal 1b is at a minimum, the source-to-drain current through the oscillating FET P1 is at a maximum while the source-to-drain current through the oscillating FET N1 is at a minimum. Therefore, the drains of the oscillating FETS N1, P1 provide complementary feedback to the crystal terminal 1a to sustain the crystal oscillation. The tuning capacitors C1 and C1' assure that, at the desired oscillation frequency (which in the preferred embodiment is 32,768 Hz), the phase change around the oscillator loop is 360° to provide positive feedback. The crystal 1 has an internal inductance which, in conjunction with the capacitor C1, induces a phase change in the voltage of approximately 90°. The phase difference between the gate voltage and the drain voltage of the FET N1 is approximately 180° because the FET N1 acts as an inverter between its gate and drain voltages. The remaining phase shift of approximately 90° is furnished by the variable tuning capacitor C1'.

A large output signal is achieved by connecting the gates of the oscillating FET pair N1, P1 to the gates of the output FET pair N8, P8, respectively, having their sources connected to the voltage references $V_{ss}$ and $V_{dd}$ respectively and their drains connected together to the oscillator node 18. Amplification of the oscillator signal appearing at the node 18 is achieved without requiring additional current consumption through the oscillating FET pair N1, P1 by forming the source-to-drain channels of the output FET pair N8, P8 to have larger width-to-length ratios than the oscillator FET pair N1, P1.

In the preferred embodiment of the invention, the oscillator is buffered from other elements in the watch circuit (not shown) by means of an inverter amplifier 20 havings its input connected to the oscillator node 18 and its output 22 comprising a buffered oscillator output.

Figure 5A:
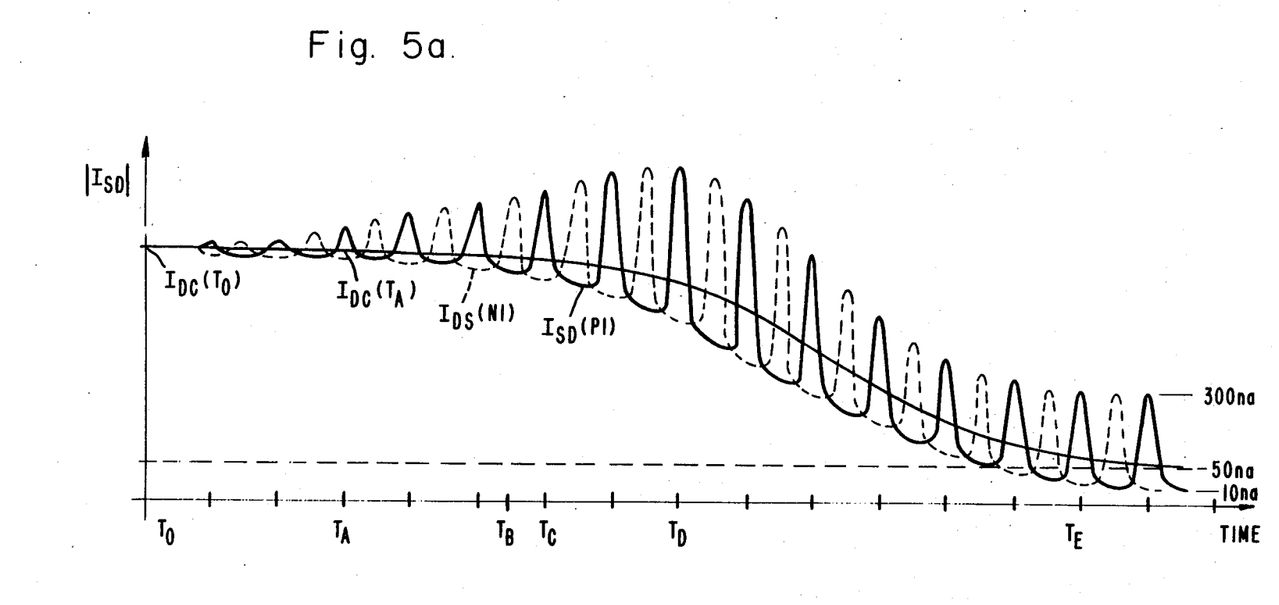
FIG. 5a is a diagram of the time domain waveform of the magnitude of the source-to-drain currents through the first complementary FET pair of FIG. 4.
Figure 5B:
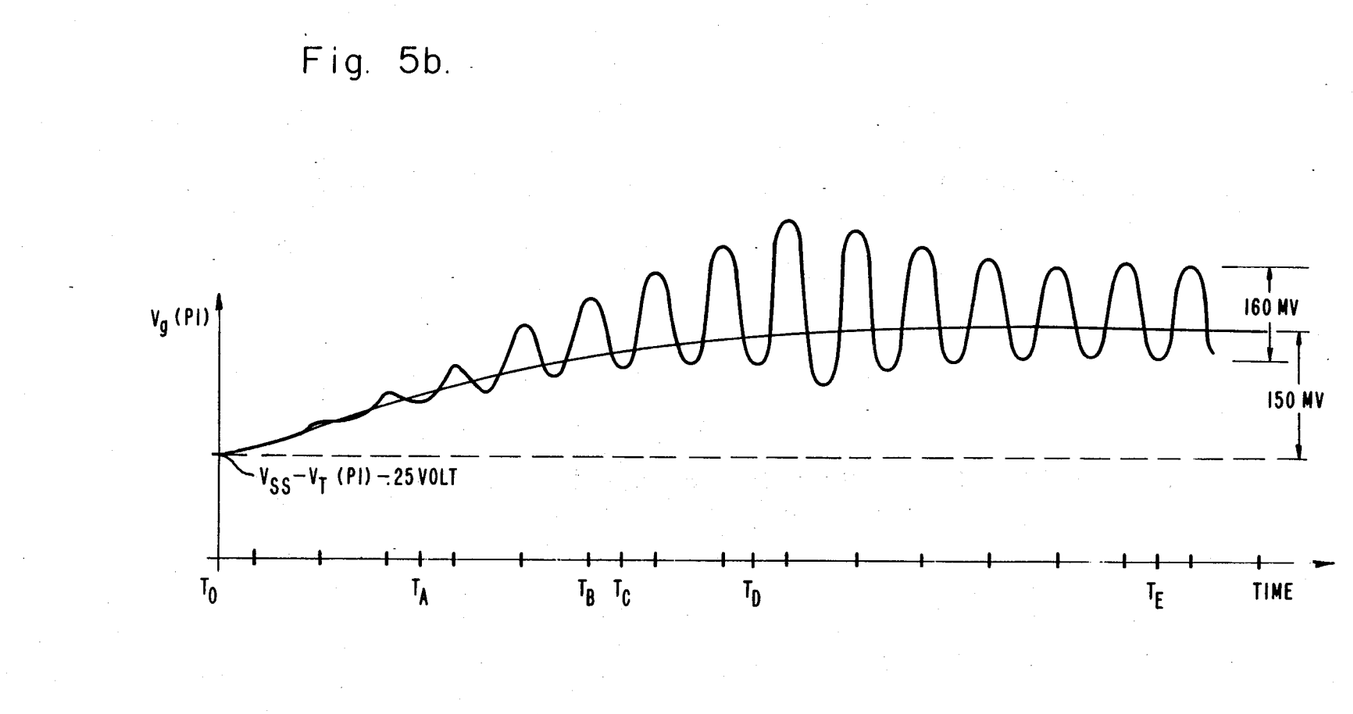
FIG. 5b is a diagram of the time domain waveform of the gate voltage of the P-channel FET of the first complementary FET pair of FIG. 4.
Figure 5C:
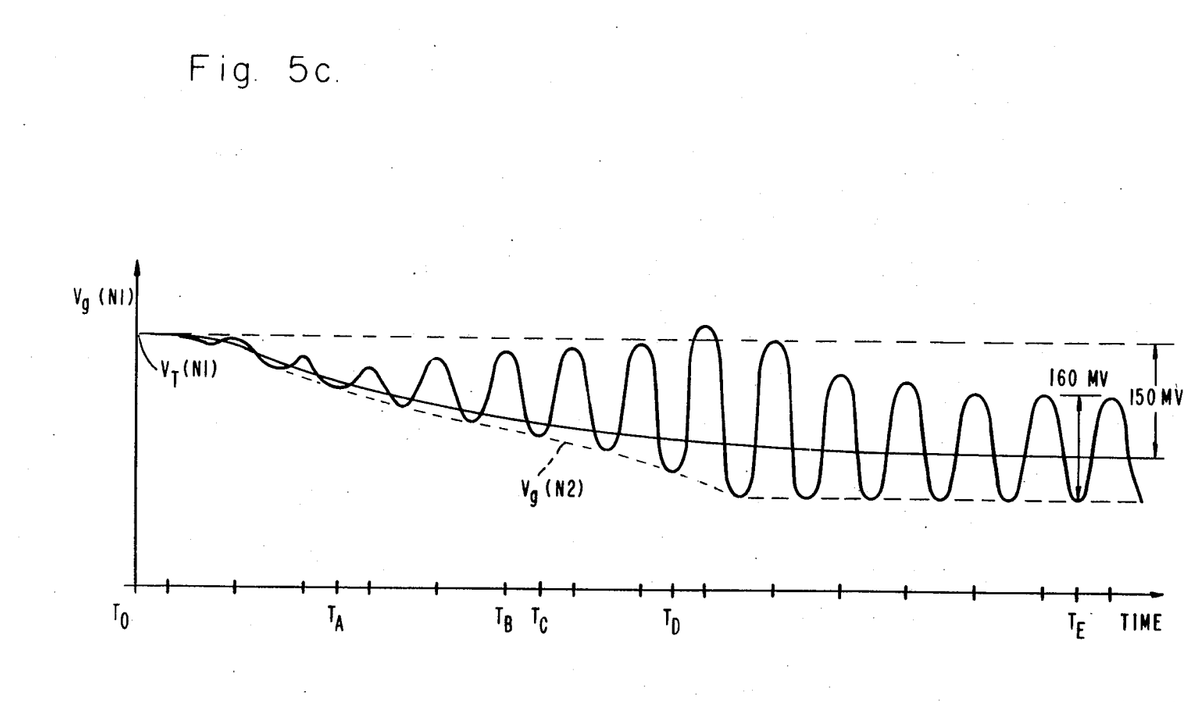
FIG. 5c includes a diagram of the time domain waveform of the gate voltage of the N-channel FET of the first complementary FET pair of FIG. 4 and a diagram of the time domain waveform (in dashed line) of the gate voltage of a control FET in the current regulator of FIG. 4.

Operation of the oscillator loop is illustrated in the diagrams of FIGS. 5a–e. At time $T_0$ of FIG. 5a, a negative voltage on the order of 1 to 3 volts is applied to the voltage reference $V_{ss}$ while the voltage reference $V_{dd}$ is held to substrate ground. As illustrated in FIG. 5a, the source-to-drain currents $I_{ds}$(N1) and $I_{sd}$(P1) through the oscillating FETS N1, P1, respectively, assume an initial dc value $I_{dc}(T_o)$. Note that at time $T_0$ there is no fluctuation in the source-to-drain currents through the oscillating FETS N1, P1 because the crystal 1 has not begun perceptible oscillation. Simultaneously, as illustrated in FIG. 5b and 5c, the gate voltages applied to the oscillating FETS N1, P1 assume values near their respective threshold voltages. Subsequently, FIG. 5a shows that oscillation in the source-to-drain current of the oscillating FETS N1, P1 slowly builds up as the crystal 1 begins to oscillate. At a later time, $T_a$, the dc average of the source-to-drain current illustrated in FIG. 5a has fallen to a lower level, $I_{dc}(T_a)$, as a result of the increasing oscillation of the source-to-drain current. It should be noted that FIG. 5a is merely a simplified representation of the time domain waveforms illustrated therein and that the oscllation actually has a much higher frequency than the waveforms of FIG. 5a.

As discussed previously, the gate voltage and the drain-to-source current of the FET N1 are 180° out of phase. Accordingly, referring to FIG. 5c, it is seen that the ac component of the gate voltage $V_g$(N1) illustrated in FIG. 5c is approximately 180° out of phase with the ac waveform of the source-to-drain current $I_{sd}(N1)$ illustrated in FIG. 5a. Furthermore, the ac waveform of the gate voltage $V_g(P1)$ applied to the FET P1 is in phase with the gate voltage $V_g(N1)$ illustrated in FIG. 5c because the gates of the FETS N1, P1 are coupled together through the capacitors C2, C3. The magnitude peaks of the source-to-drain currents $I_{sd}(N1)$, $I_{sd}(P1)$ are approximately 180° out of phase by reason of the complementary operation of the FET pair N1, P1. Thus, when the gate voltages $V_g(P1)$ and $V_g(N1)$ are at a maximum positive peak, such as at time $T_b$, the source-to-drain currents $I_{sd}(P1)$ and $I_{sd}(N1)$ are at a minimum and a maximum, respectively. Conversely, at time $T_c$ when the gate voltages are at a minimum amplitude, the source-to-drain currents $I_{sd}(P1)$ and $I_{sd}(N1)$ are at a maximum and a minimum value respectively.

A significant feature of the waveforms illustrated in FIG. 5a is that the average dc level $I_{dc}$ decreases as the amplitude of the oscillation illustrated in FIG. 5a increases. Thus, at time $T_0$, the average dc current $I_{dc}$ is at a maximum, while at time $T_a$, after oscillation has perceptibly begun, the average dc current $I_{dc}$ has decreased by reason of the ac oscillation of the source-to-drain current. The decrease in the average dc current $I_{dc}$ with the growth of oscillation in the source-to-drain current illustrated in FIG. 5a plays a significant role in the operation of the oscillator bias loop 17.

B. Oscillator Bias Loop 17

The oscillator bias loop 17 includes a resistive FET N3, a low pass filter 17a, a current regulator 17b and a bias supply 17c.

1. Resistive FET N3

The resistive FET N3 has its source and drain connected between the drain and gate of the oscillating FET N1. The bias supply 17c controls the gate voltage of the resistive FET N3. The source-to-drain resistance across the FET N3 is such that the oscillating FET N1 operates in the saturated mode discussed previously. The advantage of operating the FET N1 in the saturated mode is that the amount of source-to-drain current required for a given amount of oscillator loop gain is minimized. The FET P1 is likewise held in saturated mode to accomplish the same advantage, as will be described below in this specification.

As discussed above in connection with FIG. 5a, the dc average $I_{dc}$ of the source-to-drain current through the FET N1 decreases as the amplitude of the oscillation of the crystal 1 increases. Therefore, the dc average of the gate voltage $V_g(N1)$ illustrated in FIG. 5c applied through the resistive FET N3 to the gate of the oscillating FET N1 decreases in proportion to the decrease of the dc average of the current $I_{dc}$ of FIG. 5a. As a result, the source-to-drain conductivity of the FET N1 decreases with its gate voltage $V_g(N1)$ illustrated in FIG. 5c. Thus, an oscillation is slowly built up in the crystal 1, the current consumption through the oscillating FET pair N1, P1 is reduced.

2. Low Pass Filter

The low pass filter 17a receives the input voltage $V_g(N1)$ from the resistive FET N3 and produces an output voltage $V_g(N2)$ which is applied to the input of current regulator 17b. The low pass filter 17a operates to filter out the ac component of its input voltage $V_g(N1)$, illustrated in FIG. 5c in such a manner that the output voltage $V_g(N2)$ follows the negative-going peaks of the ac component of the input voltage $V_g(N1)$, as illustrated in dashed-line in FIG. 5c.

The detection of the negative-going peaks of the ac component of the input voltage $V_g(N1)$ is accomplished by a rectifying FET N4a connected between the resistive FET N3 and a capacitor C7, the capacitor C7 being connected to the voltage reference $V_{dd}$. The capacitor C7 is charged through the rectifying FET N4a in the negative direction so that the rectifying FET N4a and the capacitor C7 act as a negative going peak detector which charges another capacitor C8 through another resistive FET N4b. A filter capacitor C4 is charged from the capacitor C8 through a switched FET N4c having its gate controlled by a clock signal $\phi$ having a pulse repetition rate F generated by a pulse generator 17aa. In effect, the filter capacitor C4 is charged through a high resistance (which is proportional to $(FC_8)^{-1}$ so that the waveform of the output voltage $Vg(N2)$ is relatively smooth. An advantage of the low pass filter 17a is that the high resistance through which the filter capacitor C4 is charged does not require a large resistor in the circuit which would take up a great deal of space.

The combination of the negative peak detection performed by the FET N4a with the capacitor C7 and the decrease in the dc average in the input voltage $V_g(N1)$ with the increase in oscillation of the source-to-drain currents $I_{sd}(N1)$, $I_{sd}(P1)$ causes the output voltage $V_g(N2)$ from the low pass filter 17a to decrease rapidly with increase in the amplitude of the oscillation of the source-to-drain current through the FET pair N1, P1. This phenomenon is clearly illustrated in FIG. 5c showing that the output voltage $V_g(N2)$ (shown in dashed line) not only follows the decrease in the dc average of the input voltage $V_g(N1)$ but also falls below the negative going peaks of the ac component of the input voltage $V_g(N1)$. The output voltage $V_g(N2)$ is applied to the input of current regulator 17b.

3. Current Regulator

The current regulator 17b increases the gate voltage on the oscillating FET P1 in order to reduce its current consumption as the amplitude of the ac oscillation of its source-to-drain current $I_{sd}(P1)$ increases. The current regulator 17b includes the complementary N-channel and P-channel FET pair N2, P2, the gate of the FET N2 receiving the output voltage $V_g(N2)$ of the low pass filter 17a. The drain of the FET N2 is connected to the gate of the oscillating FET P1 and to the drain and gate of the FET P2, the FET P2 having its source connected to the voltage reference $V_{dd}$. The source of the FET N2 is connected to the source of a current limiting FET N11 and to the voltage reference $V_{ss}$. The gate and source of the current regulating FET N2 are connected to the gate and source respectively of a current monitoring FET N5 having its drain connected to the input of bias supply 17c. The bias supply 17c controls the gate voltages of the FETS N3, N4a, N4b and N11 and controls the drain voltage of the current limiting FET N11, as will be described later in the specification.

Figure 5D:
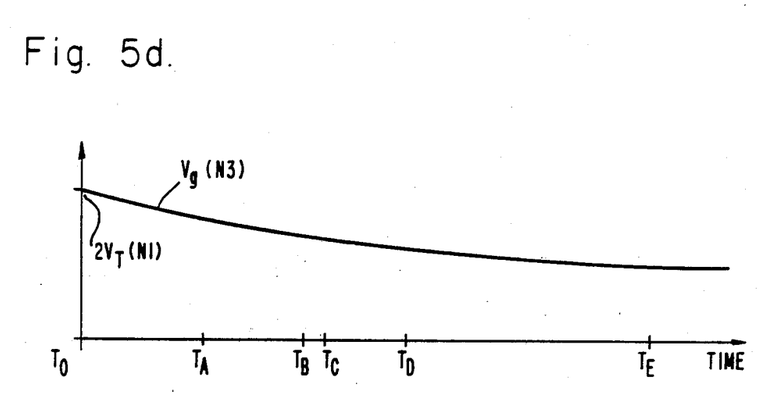
FIG. 5d includes a diagram of the time domain waveform of the gate voltage of an FET comprising a resistance element connected between the gate and drain of the N-channel FET of the first FET pair of FIG. 4.
Figure 5E:
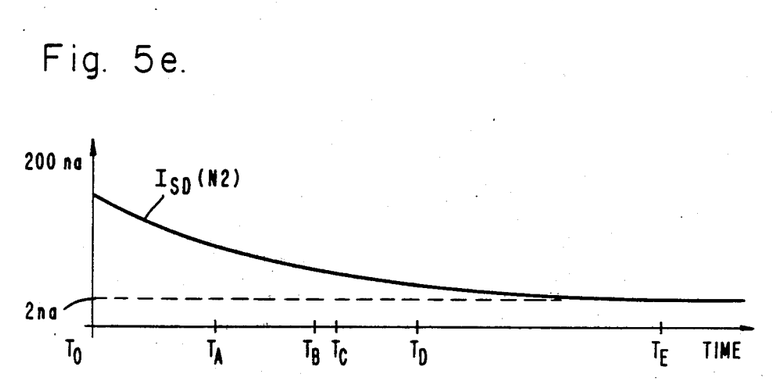
FIG. 5e is a diagram of the time domain waveform of the source-to-drain current through the control FET of the current regulator of FIG. 4.

The operation of the current regulator 17b is as follows. As the voltage $V_g(N2)$ applied to the gate of the current regulating FET N2 decreases with the onset of oscillation of the crystal 1 as illustrated in FIG. 5c, the source-to-drain conductivity through the current regulating FET N2 decreases, thus increasing the drain voltage of the current regulating FET P2 applied to the gate of the oscillating FET P1. A corresponding decrease in the source-to-drain current $I_{sd}(N2)$ through the current regulating FET N2 is illustrated in FIG. 5e. The result is that, as the amplitude of the oscillation of the source-to-drain current $I_{sd}(P1)$ of the FET P1 increases, the current regulator 17b operates to reduce the source-to-drain current of the FET P1. Thus, FIGS. 5a and 5b show that the source-to-drain current $I_{sd}(P1)$ is allowed to increase by the current regulator 17b to a maximum oscillation amplitude at a time $T_d$, after which the increase in the gate voltage $V_g(P1)$ causes a corresponding decrease in the oscillation amplitude and dc bias level of the source-to-drain current $I_{sd}(P1)$. The advantage of this feature is that the current regulator 17b permits the magnitude of the oscillation of the electric field in the crystal 1 to increase freely when power is first supplied to the circuit of FIG. 4 to insure reliable starting. However, minimization of current consumption is achieved thereafter by reducing the current consumption through the source and drain of the FET P1. The decrease in the source-to-drain current $I_{sd}(P1)$ through the FET P1 is sensed through the resistive FET N3 at the gate of the oscillating FET N1 so that a corresponding decrease in the source-to-drain current $I_{sd}(N1)$ through the FET N1 is accomplished, as illustrated in FIG. 5a. At time $T_e$ (typically on the order of 10 seconds after time $T_o$) the system reaches an equilibrium condition in which the dc bias of the gate voltages $V_g(P1)$ and $V_g(N1)$ illustrated in FIGS. 5b and 5c respectively and of the source-to-drain currents $I_d(P1)$ and $I_d(N1)$ illustrated in FIG. 5a are held at constant values while the magnitudes of their ac components are also constant. Thus, after time $T_e$, the current consumption of the circuit of FIG. 4 is minimized to an equilibrium level which, in the preferred embodiment, is on the order of only 50 nanoamps, a significant improvement over the prior art.

The current limiting FET N11 functions to provide greater reliability in starting oscillation of the crystal 1 when power is first applied at the voltage references $V_{ss}$ and $V_{dd}$. At time $T_0$ when power is first applied to the voltage references $V_{ss}$ and $V_{dd}$, no oscillation occurs and, as illustrated in FIG. 5e, the source-to-drain current $I_{sd}(N2)$ through the FET pair N2, P2 is at a high initial level. If, before oscillation is achieved, the current $I_d(N2)$ becomes excessive, the FET P2 could become a significant load on the oscillator loop so that the feedback between the crystal terminals 1a and 1b would not necessarily be in phase and oscillation might never be achieved. Therefore, in order to prevent such an occurrence, the current limiting FET N11 produces a significant voltage drop across its source and drain whenever the source-to-drain current $I_{sd}(N2)$ becomes excessive. The voltage drop across the current limiting FET N11 raises the source voltage of the FET N2 so that its source-to-gate voltage is reduced, thus reducing the source-to-drain conductivity of the FET N2 and reducing the current flow through the FET P2. In this manner, the source-to-drain current flow through the FET P2 is effectively limited so as to prevent it from significantly loading the oscillator loop at time $T_0$, thus assuring reliable start-up of the oscillator. By limiting the current through the FET P2, the FET P1 is advantageously held in saturation, which also enhances oscillation start-up.

4. Bias Supply

The bias supply 17c includes five P-channel FETS P3, P5, P6, P7 and P12 having their gates connected together and their sources connected to the voltage reference $V_{dd}$, a capacitor C6 being connected between their gates and their sources. The drain of the FET P3 is connected to its gate and to the drain of the current monitoring FET N5. The FET P5 is connected through the series combination of N-channel FETS N6 and N7 to the drain of the current limiting FET N11.

The P-channel FETS P3, P5 function as a current mirror responding to the source-to-drain current of the current monitoring FET N5 to supply a corresponding source-to-drain current through the series combination of the FETS N7, N6 to the drain of the current limiting FET N11. The current monitoring FET N5 acts to replicate the source-to-drain current through the current regulating FET N2 to supply a corresponding current to the drain of the current limiting FET N11. As previously mentioned in connection with the description of the current regulator 17b, the voltage drop across the current limiting FET N11 functions to limit the source-to-drain current across the FET P2 in order to prevent the FET P2 from excessively loading the oscillator loop when the circuit is first powered up. A significant feature of this invention is that the source-to-drain voltage drop across the FET N11 is augmented because the sources of the FETS N2, N5 are connected to the source of the current limiting FET N11, and therefore the source-to-drain current across the FET N11 is a factor of 2.5 greater than the source-to-drain current across the FET N2. As a result, the voltage drop across the FET N11 may be quite large while its resistance and hence the length-to-width ratio of its source-to-drain channel, may be minimized by a factor of 2.5 for a given voltage drop, significantly reducing the amount of space occupied by the FET N11.

The gates of the FETS N6 and N7 are connected to their respective drains, the drain of the FET N7 being connected to the gates of the FETS N3, N4a and N4b. This feature regulates the gate voltages of the FETS N3, N4a, and N4b to follow the source-to-drain current of the FET N5 (replicating the source-to-drain current across the FETS P2, N2). Accordingly, as the gate voltage $V_g(N2)$ of the FET N2 decreases as illustrated in FIG. 5c with the amplitude growth of oscillation in the oscillation loop, the gate voltage $V_g(N3)$ applied from the drain of the FET N7 to the gates of the transistors N3, N4a, N4b decreases as illustrated in FIG. 5d. This feature contributes to the reduction of the current $I_{sd}(N1)$ from time $T_d$ to time $T_e$, as illustrated in FIG. 5a.

The gate of the FET N1 is connected across source and drain of the FET P7 to the voltage reference $V_{dd}$. This feature assists the growth in the amplitude of the oscillation of the source-to-drain currents illustrated in FIG. 5a beginning at time $T_0$ when the circuit is first powered up. Specifically, at time $T_0$ before oscillation has begun, the gate of the FET N1 is held near its threshold voltage by the FET P7 so that the FET N1 is initially conductive even in the absence of oscillation. As a result, the FET N1 is available to provide feedback between the crystal terminals 1a, 1b to assure reliable starting of the oscillation when the circuit is first turned on. Without this feature of the invention, there is a risk that the FET N1 would never permit sufficient source-to-drain current flow to achieve sustained oscillation of the crystal 1.

The gate voltage of the current limiting FET N11 is provided by the FETS P12, N12 and N14. The gate of the FET N11 is connected through the source and drain of the FET P12 to the voltage reference $V_{dd}$, the drain of the FET P12 being connected through the source and drain of the series combination of FETS N12 and N14 to the voltage reference $V_{ss}$, the FETS N12 and N14 having their gates connected to their drains. The FET P12 acts as a current source to the FETS N12 and N14, the FETS N12 and N14 acting as a voltage reference to the gate of the FET N11. In the preferred embodiment, the gate voltage $V_g$(N11) of the FET N11 is at or near twice its threshold voltage.

The crystal terminal 1b is connected through the source and drain of the FET P6 to the voltage reference $V_{dd}$ to provide a voltage reference to the node 1b between the capacitors C2, C3. The advantage of this is that the capacitors C2, C3 comprise two electrodes overlying a common P-type diffusion in the N-type substrate in which the circuit of FIG. 4 is formed, the diffusion being connected to the crystal terminal node 1b. Thus, the FET P6 provides a reference voltage at which the potential of the common diffusion of the capacitors C2, C3 is held.

III. MOS Layout Design and Performance

All of the capacitors except C8 (and, of course, the external capacitor C1') are MOS capacitors of the type well-known in the art, each comprising a metal electrode overlying a P-type diffusion formed in the N-type substrate. The capacitor C8 is an electrode overlying an N-type diffusion formed in the P-type well region encompassing the FET N7. The capacitors C2, C3 are formed as individual metal electrodes over a common diffusion connected to the crystal terminal 1b as noted above. In the diagram of FIG. 4, the curved electrode of each capacitor corresponds to its diffusion, while the straight-line electrode corresponds to the metal electrode overlying the diffusion.

The P-channel FETS are all formed in the N-type substrate while the N-channel FETS are formed in two different P-type wells formed in the N-type substrate. The first well encompasses the FETS N3, N4a, N4b, N4c, N7 and N12, the FET N7 having its source connected to the well. The remaining N-channel FETS N2, N5, N6, N11 and N14 are formed in the second well which is connected to the voltage reference $V_{dd}$. The voltage reference $V_{dd}$ is also connected to the substrate itself and is the ground reference of the circuit of FIG. 4. The FET N6 provides a voltage drop across its source and drain which defines the bias voltage applied to the source and well of the FET N7.

In the preferred embodiment, the capacitor C8 has approximately 0.154 picofarads of capacitance between its electrode and its diffusion which is coupled through the capacitor C5 to the voltage reference $V_{dd}$. An additional 0.3 picofarads of capacitance is provided by the diffusion-to-well capacitance coupled through the well-to-substrate capacitance to the voltage reference $V_{dd}$.

The capacitive values for each of the capacitors and the width-to-length ratios of the source-to-drain channels of each of the FETS are given later in this specification. If the device is made in accordance with these preferred values, the oscillation amplitudes of the various voltages and currents illustrated in FIGS. 5b, c, d, and e will be as follows. Referring to FIG. 5b, at time $T_0$ the gate voltage $V_g$(P1) has an initial value slightly less than the difference between the voltage reference $V_{ss}$ and the threshold voltage of the FET P1, this initial value being expressed as $V_{ss} - V_t$(P1) $- 0.25$ volts. The dc average of Vg(P1) increases by 150 millivolts until equilibrium is reached at about time $T_e$, the oscillation amplitude having been reduced to an ac peak-to-peak amplitude of 160 millivolts. Referring to FIG. 5c, the gate voltage $V_g$(N1) of the FET N1 and the gate voltage $V_g$(N2) of the FET N2 (shown in dashed-line FIG. 5c) both begin at an initial value approximately equal to the threshold voltage of the FET N1. Thereafter, the dc average of the gate voltage $V_g$(N1) decreases by approximately 150 millivolts when equilibrium is reached at about time $T_e$ while its oscillation amplitude is reduced from the peak amplitude achieved at time $T_d$ to an equilibrium ac peak-to-peak amplitude of 160 millivolts. The dc average of the gate voltage $V_g$(N2) decreases by time $T_e$ by approximately 250 millivolts.

Referring to FIG. 5d, the gate voltage $V_g$(N3) applied to the FETS N3, N4a and N4b begins at an initial value of approximately twice the threshold voltage of the FET N1 at time $T_0$ and decreases by approximately 350 millivolts at $T_e$ when equilibrium is reached.

Referring to FIG. 5e, the source-to-drain current of the FET N2 has an initial value of 200 nanoamps at time $T_0$ and decreases along an exponential curve corresponding to the waveform of its gate voltage $V_g$(N2) illustrated in FIG. 5c to an equilibrium value of about 2 nanoamps at time $T_e$. The time domain waveform of the gate voltage $V_g$(P2) is not illustrated because it is identical to that of the gate voltage $V_g$(P1) illustrated in FIG. 5b. Also, the time domain waveform of the source-to-drain current of the FET P2 is not separately illustrated because it is proportional to the source-to-drain current $I_{sd}$(P1) illustrated in FIG. 5a.

The oscillator of FIG. 4 is preferably formed of an N-type substrate of silicon having a crystal orientation of 100 and having phosphorus impurities of $2 \times 10^{15}$ atoms per square centimeter. The well regions are doped with boron impurities on the order of $1 \times 10^{16}$ atoms per square centimeter. The N+ regions such as those forming the N-channel sources and drains are doped with phosphorus impurities on the order of $1 \times 10^{20}$ atoms per square centimeter. The P+ regions such as those forming the P-channel sources and drains are doped with boron impurities on the order of $1 \times 10^{20}$ atoms per square centimeter. The thin oxide regions insulating the FET gates from the substrate are covered by a thin layer of silicon dioxide on the order of 850 angstroms to 950 angstroms thickness. Ion implantation may be used in a manner well known to those skilled in the art to adjust the threshold voltages of all of the P-channel FETS to be on the order of 600 millivolts with a tolerance of 200 millivolts and to adjust the threshold voltages of all of the N-channel FETS to be on the order of 650 millivolts with a 200 millivolt tolerance, the threshold voltage being defined as the gate voltage corresponding to a source-to-drain current density in the saturated mode of 40 nanoamps per square.

Other embodiments of the invention may be useful. For example, the polarities of all the devices may be reversed so that the substrate is P-type silicon, the wells being formed of N-type conductivity, and the polarities of each of the MOSFETS illustrated in FIG. 4 being reversed so that, for example, the FET N1 is a P-channel MOSFET and the FET P1 is an N-channel MOSFET, the polarity of the voltages applied to the voltage references $V_{ss}$ and $V_{dd}$ also being reversed accordingly. Alternatively, the oscillator bias loop 17 may be altered so that the current regulator 17b controls the gate voltage of the FET N1 (instead of the gate voltage of the FET P1 as in the preferred embodiment), the resistive element N3 being connected to the gate of the MOSFET P1 (instead of to the gate of the MOSFET N1 as in the preferred embodiment). In this latter alternative embodiment, the polarities of the oscillating loop FETS P1, N1, P8, N8 would remain the same while the polarities of the FETS contained in the oscillator bias loop 17 would be reversed. For example, the resistive FET N3 would be a P-channel MOSFET while the current regulating FET P2 would be an N-channel MOSFET located in a P-type well region.

The following is a list of parameters defining the components illustrated in FIG. 4, giving the preferred width-to-length ratio (as drawn) of the source-to-drain channel of each MOSFET and giving the preferred capacitance in picofarads of each capacitor.

| | | |
|---|---|---|
| N1 | 2/.4 | Width to Length Ratio (As Drawn) |
| P1 | 3.6/.4 | Width to Length Ratio (As Drawn) |
| N2 | .6/.3 | Width to Length Ratio (As Drawn) |
| P2 | .2/1 | Width to Length Ratio (As Drawn) |
| N3 | .2/.7 | Width to Length Ratio (As Drawn) |
| P3 | .5/1 | Width to Length Ratio (As Drawn) |
| N4a | .2/.7 | Width to Length Ratio (As Drawn) |
| N4b | .2/.7 | Width to Length Ratio (As Drawn) |
| N4c | .5/.5 | Width to Length Ratio (As Drawn) |
| N5 | .6/.3 | Width to Length Ratio (As Drawn) |
| P5 | .5/1 | Width to Length Ratio (As Drawn) |
| N6 | .3/.3 | Width to Length Ratio (As Drawn) |
| P6 | .2/4.3 | Width to Length Ratio (As Drawn) |
| N7 | 2.2/.3 | Width to Length Ratio (As Drawn) |
| P7 | .2/4.9 | Width to Length Ratio (As Drawn) |
| N8 | 3.6/.3 | Width to Length Ratio (As Drawn) |
| P8 | 7.2/.3 | Width to Length Ratio (As Drawn) |
| N12 | .3/.3 | Width to Length Ratio (As Drawn) |
| N14 | .3/.3 | Width to Length Ratio (As Drawn) |
| P12 | .5/1 | Width to Length Ratio (As Drawn) |
| C1 | 6 picofarads | |
| C2 | 6.06 picofarads | |
| C3 | 10.1 picofarads | |
| C4 | 15.1 picofarads | |
| C5 | 3.1 picofarads | |
| C6 | 3.3 picofarads | |
| C7 | 7 picofarads | |
| C8 (includes the capacitance from the capacitor diffusion of C8 to the well of FET N7) | .45 picofarads ± .05 picofarads | |

What is claimed is:

1. An oscillator having regulated source-to-drain current oscillation amplitude, comprising:
a passive resonator having two terminals;
a first complementary pair of transistors comprising a first and a second conductivity type transistor, each comprising a gate, a source, a drain and a channel, said transistors having their channels connected in series combination with one another between first and second voltage references, one of said resonator terminals being connected therebetween, and their gates being individually coupled to the other of said resonator terminals;
means for applying a voltage to the gate of one transistor of said first transistor pair, said applying means responsive to an increase in the oscillation of the source-to-drain current of the other transistor of said first transistor pair for reducing the source-to-drain current of said one transistor by changing said applied gate voltage.

2. The device of claim 1 wherein said applying means permits said oscillation to freely increase when power is first supplied to said first and second voltage references, said applying means reducing the source-to-drain current through said first complementary transistor pair after said oscillation has increased to a maximum amplitude so that said source-to-drain current of said first complementary transistor pair decreases to an equilibrium amplitude having a very low average value.

3. The oscillator of claim 1 further comprising a second complementary pair of transistors of opposite conductivity types, the gates of the first conductivity type transistors of said first and second complementary pairs being connected together, the gates of the second conductivity type transistors of said first and second complementary pairs being connected together and the source-to-drain channels of said second complementary transistor pair being connected in series combination to form an oscillator output node therebetween.

4. The oscillator of claim 1 wherein said applying means comprise:
a low pass filter having an input and an output, said input connected to sense the voltage at said one resonator terminal; and
current regulator means connected to said low pass filter output for applying a regulated gate voltage to the gate of said second conductivity type transistor of said first complementary pair, and for changing said regulated gate voltage inversely in response to changes in the voltage at said low pass filter output.

5. The oscillator of claim 4 wherein said current regulator means comprises a second complementary pair of transistors of opposite conductivity types having their source-to-drain channels connected in series combination and the gate of said second conductivity type transistor of said first complementary pair being connected therebetween and to the gate of the second conductivity transistor of said second complementary pair, said low pass filter output being connected to the gate of the first conductivity type transistor of said second complementary pair.

6. The device of claim 4 wherein said low pass filter comprises:
means for performing peak detection of the voltage at said low pass filter input;
a filter capacitor connected between said low pass filter output and one of said first and second voltage references;
means for providing a high resistance path through which current from said peak detecting means charges said filter capacitor.

7. The oscillator of claim 6 wherein said peak detection means comprises a transistor having its source and drain connected between said low pass filter input and said high resistance means, one of its source and drain connected through a second capacitor to the other of said first and second voltage references, and wherein said resistance means comprises a transistor having its source and drain connected between said peak detecting means and said filter capacitor and its gate connected to receive a clock signal so as to provide an equivalent resistance which is inversely proportional to the frequency of the clock signal.

8. The oscillator of claim 5 further comprising means for controlling the source-to-drain current of the first conductivity type transistor of said second complementary pair whenever power is first applied to said first and second voltage references.

9. The oscillator of claim 8 wherein said source-to-drain current controlling means comprises a current limiting transistor having its source and drain connected between the series combination of said second complementary transistor pair and one of said voltage references, including means for applying a voltage to the gate of said current limiting transistor.

10. The oscillator of claim 1 further comprising means connected to said applying means for limiting the current consumption of said applying means whenever power is first applied to said oscillator.

11. The oscillator of claim 1 in which said applying means comprises:
- a resistive element transistor comprising a source, a drain and a gate, one of its source and drain being connected to the drain of said other transistor of said first transistor pair, the other of its source and drain being connected to the gate of said other transistor of said first transistor pair; and,
- means for biasing the gate of said resistive element transistor in such a manner as to reduce the source-to-drain current of said other transistor of said first transistor pair in response to an increase in the oscillation amplitude of said current.

12. The oscillator of claim 11 wherein said biasing means comprises:
- a low pass filter having an input and an output, said input connected to said one resonator terminal through said resistive element transistor; and
- means connected to said low pass filter output for applying a second regulated gate voltage to the gate of said resistive element transistor, said second regulated gate voltage changing in response to changes in the low pass filter output voltage.

13. The oscillator of claim 12 wherein said second regulated gate voltage applying means comprise:
- a current regulator including a current monitoring transistor of said first conductivity type having its gate connected to said low pass filter output;
- a bias supply including a current mirror having an input and an output, said current mirror input connected through at least the source and drain of said current monitoring transistor to one of said first and second voltage references, said current mirror output connected to the gate of said resistive element transistor;
- means for establishing a voltage drop at said current mirror output comprising a voltage source transistor having its gate and one of its source and drain connected to said current mirror output; and,
- means for biasing said voltage source transistor connected between the other of its source and drain and one of said first and second voltage references.

14. The oscillator of claim 1 further comprising means for maintaining the gate voltage of said first conductivity type transistor of said first complementary pair near its threshold voltage when power is first applied to said first and second voltage references.

15. The device of claim 13 further comprising means for maintaining the gate voltage of said first conductivity type transistor of said first complementary pair near its threshold voltage when power is first applied to said first and second voltage references, wherein said gate voltage maintaining means comprises a transistor of said second conductivity type having its source and drain connected between one of said voltage references and the gate of said first conductivity type transistor of said first complementary pair and its gate connected to the input of said current mirror.

* * * * *